(12) United States Patent
Fujii et al.

(10) Patent No.: US 9,695,507 B2
(45) Date of Patent: Jul. 4, 2017

(54) AUTOMATIC LITHIUM TARGET REGENERATING APPARATUS AND AUTOMATIC LITHIUM TARGET REGENERATING METHOD

(75) Inventors: Ryo Fujii, Tokyo (JP); Masaru Nakamura, Tokyo (JP); Yoshio Imahori, Tokyo (JP); Masaharu Hoshi, Hiroshima (JP)

(73) Assignee: Cancer Intelligence Care Systems, Inc., Tokyo (JP)

( * ) Notice: Subject to any disclaimer, the term of this patent is extended or adjusted under 35 U.S.C. 154(b) by 377 days.

(21) Appl. No.: 14/128,371

(22) PCT Filed: May 31, 2012

(86) PCT No.: PCT/JP2012/064047
§ 371 (c)(1),
(2), (4) Date: Dec. 20, 2013

(87) PCT Pub. No.: WO2013/001974
PCT Pub. Date: Jan. 3, 2013

(65) Prior Publication Data
US 2014/0134324 A1 May 15, 2014

(30) Foreign Application Priority Data
Jun. 27, 2011 (JP) .................. 2011-141879

(51) Int. Cl.
*C23C 16/14* (2006.01)
*C23C 16/06* (2006.01)
(Continued)

(52) U.S. Cl.
CPC .............. *C23C 16/06* (2013.01); *C23C 14/14* (2013.01); *H05H 6/00* (2013.01)

(58) Field of Classification Search
USPC ......................................... 376/108, 109, 151
See application file for complete search history.

(56) References Cited

U.S. PATENT DOCUMENTS

| 2,576,600 A | * | 11/1951 | Hanson | H05H 3/06 |
| | | | | 313/149 |
| 4,923,717 A | * | 5/1990 | Gladfelter | C23C 16/0281 |
| | | | | 427/252 |

(Continued)

FOREIGN PATENT DOCUMENTS

| CN | 101990686 A | 3/2011 |
| JP | 2001033600 A | 2/2001 |

(Continued)

OTHER PUBLICATIONS

Supplementary European Search Report dated Feb. 2, 2015 for European Document No. 12805086.1.
(Continued)

Primary Examiner — Sean P Burke
(74) Attorney, Agent, or Firm — Harness, Dickey & Pierce, PLC

(57) ABSTRACT

Provided are an automatic lithium target regenerating apparatus and an automatic lithium target regenerating method, which are equipped with a measurement function of a lithium film thickness of a lithium target, and may automatically regenerate the consumed lithium target by moving a vapor deposition source to the lithium target. An automatic lithium target regenerating apparatus (106) is allowed to automatically regenerate lithium of a lithium target. The automatic lithium target regenerating apparatus (106) includes a lithium vapor deposition unit (1) for vapor-depositing the lithium on the lithium target. The lithium vapor deposition unit (1) is allowed to vapor-deposit the lithium on the lithium target by moving to the lithium target side.

18 Claims, 12 Drawing Sheets

(51) Int. Cl.
*H05H 6/00* (2006.01)
*C23C 14/14* (2006.01)

(56) References Cited

U.S. PATENT DOCUMENTS

| | | | |
|---|---|---|---|
| 6,395,096 B1 * | 5/2002 | Madanshetty | B08B 3/12 134/1 |
| 7,098,615 B2 | 8/2006 | Swenson et al. | |
| 2011/0091000 A1 * | 4/2011 | Stubbers | H05H 3/06 376/109 |

FOREIGN PATENT DOCUMENTS

| | | |
|---|---|---|
| JP | 2007303983 A | 11/2007 |
| JP | 2009047432 A | 3/2009 |
| WO | WO-2009108906 A1 | 9/2009 |

OTHER PUBLICATIONS

New Challenges in Neutron Capture Therapy 2010, Proceedings of 14th International Congress on Neutron Capture Therapy, Buenos Aires, Argentina, Oct. 25-29, 2010.
International Search Report for PCT/JP2012/064047 (in Japanese and English), mailed Sep. 4, 2012; ISA/JP.

* cited by examiner

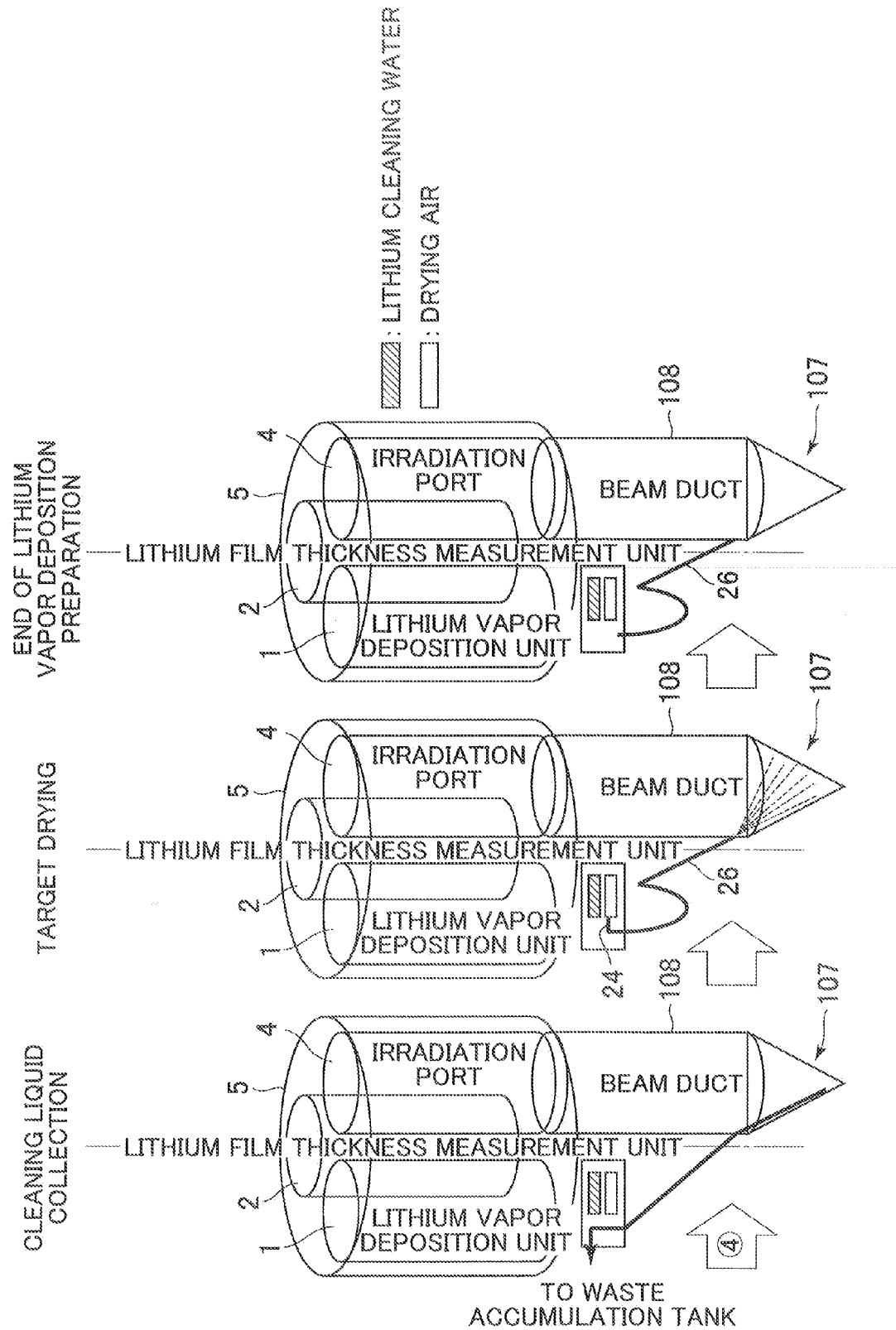

AUTOMATIC LITHIUM TARGET REGENERATING APPARATUS AND AUTOMATIC LITHIUM TARGET REGENERATING METHOD

CROSS REFERENCE TO RELATED APPLICATIONS

This application is a U.S. National Stage Application of International Application No. PCT/JP2012/064047, filed May 31, 2012. This application claims priority to Japanese Application No. 2011-141879, filed Jun. 27, 2011. The disclosures of the above applications are incorporated herein by reference.

TECHNICAL FIELD

The present invention relates to an automatic lithium target regenerating apparatus and an automatic lithium target regenerating method applicable to a neutron source using an accelerator.

BACKGROUND ART

In recent years, a neutron capture therapy for selectively exterminating cancer cells has been studied and put into clinical use in reactor facilities. Such a therapy requires the use of neutrons (thermal neutrons and epithermal neutrons) and hence had no choice but to be performed in the reactor facilities. In spite of the fact that the neutron capture therapy is clinically and medically recognized to have an effect on malignant cancer, the neutron capture therapy has not become widely used. Nuclear reactors are not originally medical facilities, and hence the nuclear reactors are not targeted for advanced medical technology. As a result, there arises a problem of radiation exposure of involved parties, and it is very inconvenient to transport a patient to a nuclear reactor facility.

In the foregoing situation, a neutron generating apparatus that may obtain neutrons without using a nuclear reactor has been studied worldwide. Specifically, the above-mentioned various problems may be solved by a neutron generating apparatus using an accelerator for accelerating charged particles such as electrons, protons, and ions at high speed. The neutron capture therapy is a cancer treatment method involving preparing an agent of a substance which is likely to effect a nuclear reaction with thermal neutrons or the like, for example, a compound containing boron-10 (B-10) which is a nonradioactive isotope, administering the prepared agent to a human body in advance so that the agent is taken into only a region in which cancer is present, that is, only cancer cells present among normal cells, and irradiating a cancer site with neutrons (thermal neutrons and epithermal neutrons) which have less effect on human bodies, to thereby selectively exterminate only the cancer cells. In this case, it is important how boron-10 is selectively taken into the cancer cells. Thus, the neutron capture therapy is a treatment method of exterminating only cancer cells through a nuclear reaction between the boron compound (for example, boronophenylalanine) and the neutrons. This method is called a boron neutron capture therapy (BNCT). In order to realize the neutron capture therapy, cutting-edge technologies in multiple fields are required (see, for example, Non-Patent Literature 1). This document relates to a "target unit" serving as a main technology, that is, a "core technology" of a neutron generating apparatus using an accelerator for realizing the neutron capture therapy.

More specifically, the above-mentioned neutron capture therapy uses a phenomenon that a certain kind of a boron compound which accumulates only on cancer cells efficiently reacts with neutrons having low energy such as thermal neutrons and epithermal neutrons. When a boron compound, for example, boronophenylalanine is infused into a patient, boronophenylalanine accumulates on cancer cells at a very high rate. When a site in which cancer is present of the patient having received boronophenylalanine by infusion is irradiated with thermal neutrons and epidermal neutrons, boron-10 of boronophenylalanine and neutrons react with each other at a cell level to release an alpha-ray having high energy of 2.33 MeV with a strong cell-killing effect, with the result that only the cancer cells are damaged by the alpha-ray to be exterminated. The range of the alpha-ray is less than 10 microns, and hence the boron neutron capture therapy (BNCT) may be considered as a cutting-edge treatment method that may distinguish normal cells from cancer cells and exterminating only the cancer cells.

A neutron source using an accelerator includes, for example, an accelerator for accelerating protons and a target unit disposed on a downstream side of the accelerator. The accelerator includes an ion source, an LEBT, an RFQ linac, an RFI linac, and the like. The target unit contains a lithium target, and protons accelerated by the accelerator are caused to collide with the lithium target to generate neutrons through a nuclear reaction (see, for example, Patent Literature 1).

CITATION LIST

Patent Literature

[PTL 1] U.S. Pat. No. 7,098,615

Non Patent Literature

[NPL 1] New Challenges in NEUTRON CAPTURE THERAPY 2010 Proceedings of 14$^{th}$ International Congress on Neutron Capture Therapy Oct. 25-29, 2010, Buenos Aires, Argentina

SUMMARY OF INVENTION

Technical Problem

As described above, the neutron source using the accelerator causes protons accelerated by the accelerator to collide with the lithium target disposed in the target unit to generate neutrons through a (p, n) reaction. The lithium target has a configuration in which a thin film of metallic lithium is formed on a support (substrate) made of copper or the like by vapor deposition.

In order to perform safe and reliable treatment, it is necessary to provide neutrons of high quality stably for a long period of time by a neutron source using an accelerator, and in order to obtain neutrons of high quality, it is necessary to irradiate pure metallic lithium with protons having low energy at a large current. Lithium has a melting point of 180° C., which is low as a melting point of a metal, and hence lithium is consumed (melted and evaporated) by tens of kilowatts of heat generated during irradiation. When lithium is consumed, that is, the thickness of lithium formed on the support (substrate) by vapor deposition is reduced, the amount of neutrons to be generated by the nuclear reaction between the lithium and the proton beam is reduced, which makes it impossible to provide neutrons of high quality. Metallic lithium is difficult to handle due to the physical properties thereof. Hitherto, it has been necessary to replace a lithium target in accordance with the consumption of lithium of the lithium target. However, there is a conventional problem as follows: in the case of generating neutrons by irradiating lithium with a proton beam, radioactive beryllium 7 is generated as a by-product and is mixed with lithium, and hence an operator is greatly exposed to radioactive beryllium 7 while replacing a lithium target, which makes it difficult for the operator to replace the lithium target. That is, the conventional method is optimum in terms of theory, but has a great number of problems for practical use.

The inventors of the present invention came up with a method of regenerating a consumed lithium target and established a basic idea of an "automatic regenerating target" for constantly keeping a lithium target in a state satisfying standards. The basic idea is to use a method involving vapor-depositing lithium on a lithium target from a lithium source, as necessary, through use of means for detecting the consumed state of lithium. A specific example thereof is described below.

The present invention has been made in view of the above-mentioned problems of the related art, and it is an object of the present invention to provide an automatic lithium target regenerating apparatus and an automatic lithium target regenerating method which are equipped with a measurement function of a lithium film thickness of a lithium target (means for determining the consumed state of lithium of a lithium target) and may automatically regenerate the consumed lithium target by moving a vapor deposition source to the lithium target.

Solution to Problem

The present invention provides an automatic lithium target regenerating apparatus, which may automatically regenerate lithium of a lithium target, the automatic lithium target regenerating apparatus including a lithium vapor deposition unit for vapor-depositing the lithium on the lithium target (the lithium vapor deposition unit including one used in vacuum or one using other inert gas media). The lithium vapor deposition unit is allowed to vapor-deposit the lithium on the lithium target by moving to the lithium target side.

Further, the automatic lithium target regenerating apparatus may further include a lithium film thickness measurement unit for measuring a film thickness of the lithium. In this case, the automatic lithium target regenerating apparatus may switch positions of the lithium vapor deposition unit and the lithium film thickness measurement unit.

Further, the automatic lithium target regenerating apparatus may further include an irradiation port. In this case, the automatic lithium target regenerating apparatus may switch positions of the lithium vapor deposition unit, the lithium film thickness measurement unit, and the irradiation port.

Further, the automatic lithium target regenerating apparatus may further include a lithium removal unit for removing the lithium. The lithium removal unit may be provided adjacent to the automatic lithium target regenerating apparatus.

Further, the lithium vapor deposition unit, the lithium film thickness measurement unit, and the lithium removal unit may each include a control unit that may perform remote control.

Further, the automatic lithium target regenerating apparatus may be used for, for example, a neutron source using an accelerator for accelerating protons.

Further, the present invention provides an automatic lithium target regenerating method including automatically regenerating lithium of a lithium target through use of the automatic lithium target regenerating apparatus according to any one of claims 1 to 8.

Further, the present invention provides an automatic lithium target regenerating method, which may automatically regenerate lithium of a lithium target, the automatic lithium target regenerating method including vapor-depositing the lithium on the lithium target by moving a lithium vapor deposition source for vapor-depositing the lithium on the lithium target to the lithium target side.

Further, the automatic lithium target regenerating method may be a method of partially regenerating the lithium target (partially regenerating function). In this case, the automatic lithium target regenerating method may further include measuring a film thickness of the lithium. The measuring may be performed before the vapor-depositing or after the vapor-depositing.

On the other hand, the automatic lithium target regenerating method may be a method of entirely regenerating the lithium target (entirely regenerating function). In this case, the automatic lithium target regenerating method may further include removing the lithium. The removing the lithium may include: jetting cleaning liquid to the lithium of the lithium target; and drying the lithium target after the jetting. In this case, the removing is performed before the vapor-depositing. Further, the automatic lithium target regenerating method may further include measuring a film thickness of the lithium. The measuring is performed after the vapor-depositing.

Note that, as an advanced form, the present invention is also applicable to a system not including a switching mechanism as described above, that is, an integrated chamber system in which each process is integrated partially or entirely. Also in this case, the present invention includes a "partially regenerating function" and an "entirely regenerating function" of a lithium target.

Further, the automatic lithium target regenerating method may be applied to, for example, a method of generating neutrons by reacting protons accelerated by an accelerator with the lithium of the lithium target.

Advantageous Effects of Invention

According to one embodiment of the present invention, consumed lithium of the lithium target may be regenerated automatically by moving the vapor deposition source to the lithium target. Thus, it is not necessary to replace the lithium target in accordance with the consumption of lithium of the lithium target.

In the case where the present invention is equipped with a measurement function of a lithium film thickness of the lithium target, distribution measurement of a lithium film thickness of the lithium target may be performed, and the consumed state of lithium of the lithium target may be determined. Further, the local regeneration (partially regenerating function) or entire regeneration (entirely regenerating function) of lithium of the lithium target may be performed automatically.

BRIEF DESCRIPTION OF DRAWINGS

FIG. 12 is a schematic view illustrating states of the lithium vapor deposition unit, the lithium film thickness measurement unit, and the irradiation port during cleaning and removing of lithium.

DESCRIPTION OF EMBODIMENTS

Figure 1:
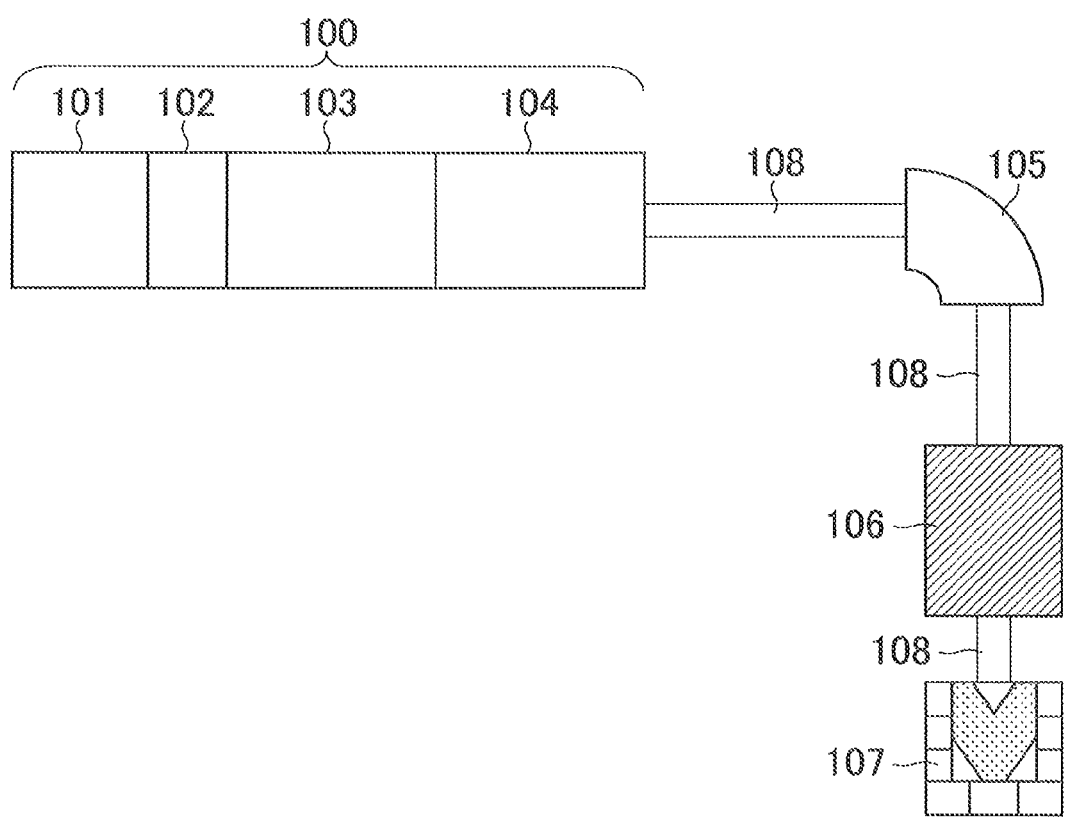
FIG. 1 is a schematic view of an example of a neutron source using an accelerator to which an automatic lithium target regenerating apparatus according to the present invention may be applied.

A best mode for carrying out an automatic lithium target regenerating apparatus that may automatically regenerate a thin film in which lithium has been consumed in a lithium target is described as an example of the present invention with reference to the drawings. FIG. 1 is a schematic view of an example of a neutron source using an accelerator to which the automatic lithium target regenerating apparatus according to the present invention may be applied. In FIG. 1, reference numeral 100 denotes an accelerator. The accelerator 100 is a device for accelerating protons, and has a configuration in which an ion source 101, an injector (LEBT) 102, a radio-frequency quadrupole (RFQ) linac 103, and an RF focused inter-digital (RFI) linac 104 are respectively arranged in the stated order from an upstream side to a downstream side. The ion source 101 is a device for converting protons into positive ions. The LEBT 102 serves as an interface between the ion source 101 and the accelerator. Further, the RFQ linac 103 forms an initial-stage accelerator for accelerating protons, and the RFI linac 104 serves as a latter-stage accelerator for accelerating protons. Note that, as the kind of the accelerator and the lineup of the respective elements, optimum ones may be selected at each time.

Further, a bending magnet 105 is disposed on a downstream side of the accelerator 100. The bending magnet 105 bends the direction of the protons accelerated by the accelerator 100 by 90°. An accelerator neutron source may also be formed without providing the bending magnet. An automatic lithium target regenerating apparatus 106 according to the present invention is disposed on a downstream side of the bending magnet 105. The automatic lithium target regenerating apparatus 106 restores and regenerates a lithium (film) of a lithium target consumed through the reaction with the protons. The automatic lithium target regenerating apparatus 106 is specifically described later. A target unit 107 containing the lithium target is disposed on a downstream side of the automatic lithium target regenerating apparatus 106. The target unit 107 is a device for generating neutrons through the reaction between the protons and lithium. The lithium target has a configuration in which a metallic lithium thin film is formed on a support (substrate) made of copper or the like by vapor deposition. Although the lithium target shown in this embodiment is a cone-shaped target in which a lithium thin film is formed on an inner wall surface (inner surface), the lithium target is not limited to that shape. Needless to say, the lithium target may be a target of any shape, for example, a plate-shaped target in which a lithium thin film is formed on a surface.

Accordingly, the automatic lithium target regenerating apparatus 106 is disposed between the accelerator 100 and the target unit 107. Note that, reference numeral 108 denotes a beam transport serving as a beam duct for guiding the protons accelerated by the accelerator 100 into the target unit 107.

Figure 2:
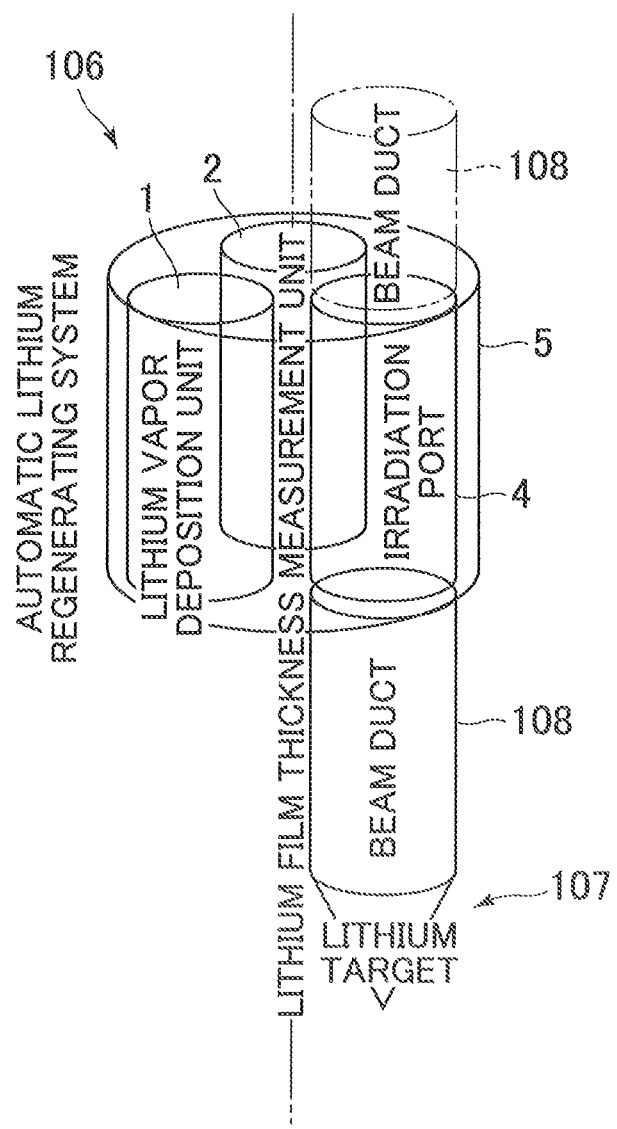
FIG. 2 is a schematic view illustrating an automatic lithium target regenerating apparatus according to the present invention.

Next, the automatic lithium target regenerating apparatus 106 which is a characteristic part of the present invention is described specifically. As illustrated in FIG. 2, the automatic lithium target regenerating apparatus 106 mainly includes a lithium vapor deposition unit 1, a lithium film thickness measurement unit 2, a lithium removal unit 3 (see FIG. 5), and an irradiation port 4.

The automatic lithium target regenerating apparatus 106 includes a main body 5 having a cylindrical outer case, which is disposed between the beam duct 108 on the accelerator 100 side (upstream side) (beam duct on an upper side represented by a dotted line in FIG. 2) and the beam duct 108 on the target unit 107 side (beam duct on a lower side represented by a solid line in FIG. 2). The lithium vapor deposition unit 1, the lithium film thickness measurement unit 2, and the irradiation port 4 are provided in the main body 5 so as to be driven to rotate in a circumferential direction. The lithium vapor deposition unit 1, the lithium film thickness measurement unit 2, and the irradiation port 4 are respectively provided with a cylindrical outer case, and the positions thereof may be switched by rotational drive (movement) in the circumferential direction in the main body 5 so that the lithium vapor deposition unit 1, the lithium film thickness measurement unit 2, and the irradiation port 4 may be respectively placed between the beam ducts on the upstream side and the downstream side. The entire inside of the main body 5 of the automatic lithium target regenerating apparatus 106 is kept in a vacuum state, and hence the above-mentioned switching is performed in vacuum environment. In the state illustrated in FIG. 2, the irradiation port 4 is positioned between the beam duct 108 on the upstream side and the beam duct 108 on the downstream side, with the axis line thereof being positioned on a track center of a proton beam. This state is defined as an initial position. Note that, the irradiation port 4 serves to block neutrons generated through the nuclear reaction between the lithium target in the target unit 107 and the proton beam.

Figure 3:
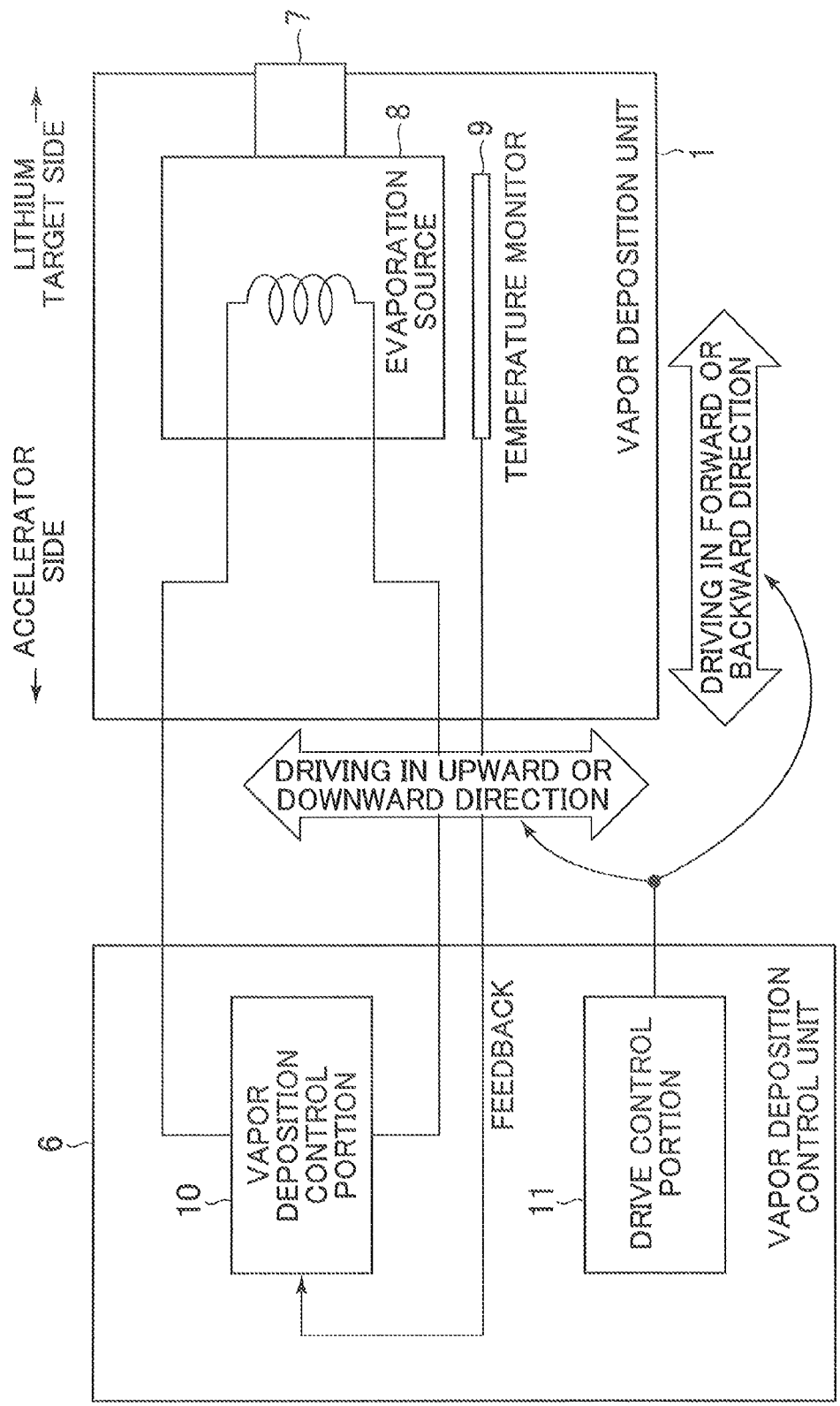
FIG. 3 is a schematic diagram illustrating a lithium vapor deposition unit applicable to the automatic lithium target regenerating apparatus according to the present invention.

FIG. 3 is a schematic diagram of the lithium vapor deposition unit (vapor deposition source) 1 for vapor-depositing lithium on a lithium target. As illustrated in FIG. 3, the lithium vapor deposition unit 1 is a unit in a vacuum state provided in the main body 5 and further includes a vapor deposition control unit 6 that may remotely control the lithium vapor deposition unit 1 and being disposed in an appropriate place. The lithium vapor deposition unit 1 includes a filament 7, an evaporation source 8, a temperature monitor 9, and the like. On the other hand, the vapor deposition control unit 6 includes a vapor deposition control portion 10, a drive control portion 11, and the like. The vapor deposition control portion 10 is designed so as to control the evaporation source 8 and to subject the evaporation source 8 to feedback control through use of the temperature of the evaporation source 8 detected by the temperature monitor 9. Further, the drive control portion 11 is designed so as to adjust the position of the vapor deposition unit 1 between the storage position and the vapor deposition position of the unit by driving the vapor deposition unit 1 upward or downward and driving the vapor deposition unit 1 forward or backward. That is, the lithium vapor deposition unit 1 may vapor-deposit lithium on the lithium target by being moved to the lithium target side by the drive control portion 11. As is well known, the vapor deposition performed by the lithium vapor deposition unit 1 is vacuum vapor deposition, and the lithium vapor deposition unit 1 heats the evaporation source 8 by supplying a current to the evaporation source 8 so as to dissolve lithium in a high vacuum and vapor-deposits the dissolved lithium on the lithium target.

Figure 4:
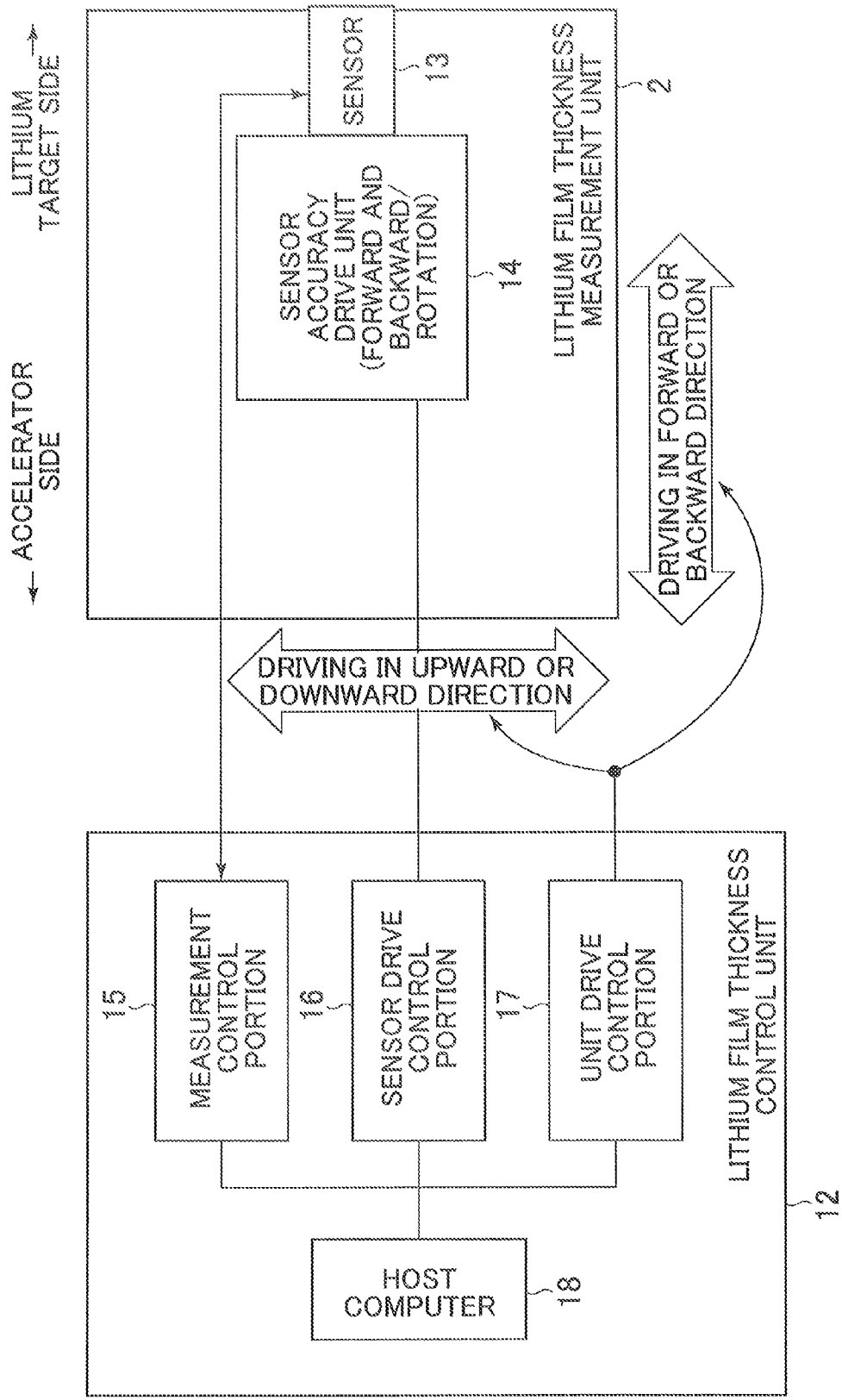
FIG. 4 is a schematic diagram illustrating a lithium film thickness measurement unit applicable to the automatic lithium target regenerating apparatus according to the present invention.

FIG. 4 is a schematic diagram of the lithium film thickness measurement unit 2 for measuring a lithium film thickness. As illustrated in FIG. 4, the lithium film thickness measurement unit 2 is a unit in a vacuum state provided in the main body 5 and further includes a lithium film thickness control unit 12 that may remotely control the lithium film thickness measurement unit 2 and being disposed in an appropriate place. The lithium film thickness measurement unit 2 mainly includes a measurement sensor 13 and a sensor accuracy drive unit 14 for driving the sensor 13 in an axial direction (forward or backward direction) and/or rotationally drives the sensor 13 with high accuracy. On the other hand, the lithium film thickness control unit 12 includes a measurement control portion 15, a sensor drive control portion 16, a unit drive control portion 17, a host computer 18 connected to the measurement control portion 15, the sensor drive control portion 16, and the unit drive control portion 17 so as to control the unit 12 as a whole, and the like. The measurement control portion 15 performs measurement control of the sensor 13, and the sensor drive control portion 16 performs drive control of the sensor accuracy drive unit 14. Further, the unit control portion 17 is designed so as to adjust the position of the lithium film thickness measurement unit 2 between the storage position and the measurement position of the unit by driving the lithium film thickness measurement unit 2 upward or downward and driving the lithium film thickness measurement unit 2 forward or backward. The lithium film thickness measurement by the lithium film thickness measurement unit 2 may be performed by a laser displacement measurement method and an α-ray measurement method.

Figure 5:
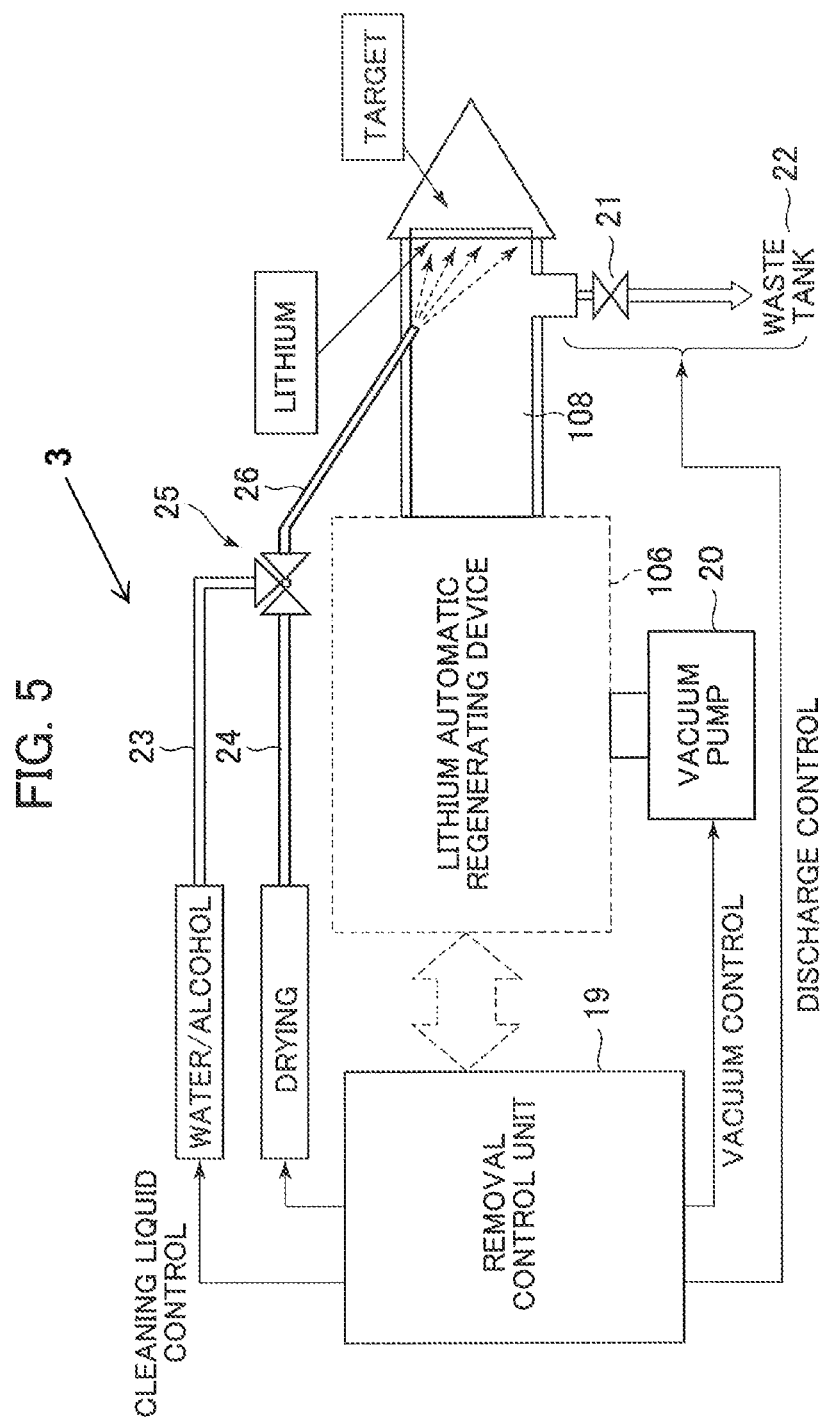
FIG. 5 is a schematic diagram illustrating a lithium removal unit applicable to the automatic lithium target regenerating apparatus according to the present invention.

FIG. 5 is a schematic diagram of the lithium removal unit 3 for removing a lithium thin film of the lithium target in the target unit 107. As illustrated in FIG. 5, the lithium removal unit 3 is a unit provided adjacent to the main body 5, and mainly includes a removal control unit 19 that may perform remote control and being disposed in an appropriate place. The removal control unit 19 is designed so as to control a vacuum pump 20 and to control discharged water of a waste tank 22 having a vacuum valve 21 provided at the beam duct 108. Further, the removal control unit 19 is designed so as to control cleaning liquid (water/alcohol) of a cleaning liquid line 23 and to control a drying line 24. The cleaning liquid line 23 and the drying line 24 are connected to a nozzle line 26 through a vacuum valve 25. Note that, as the cleaning liquid, pure water or other solutions as well as water/alcohol mixed liquid shown in this example may be selected appropriately.

Figure 6:
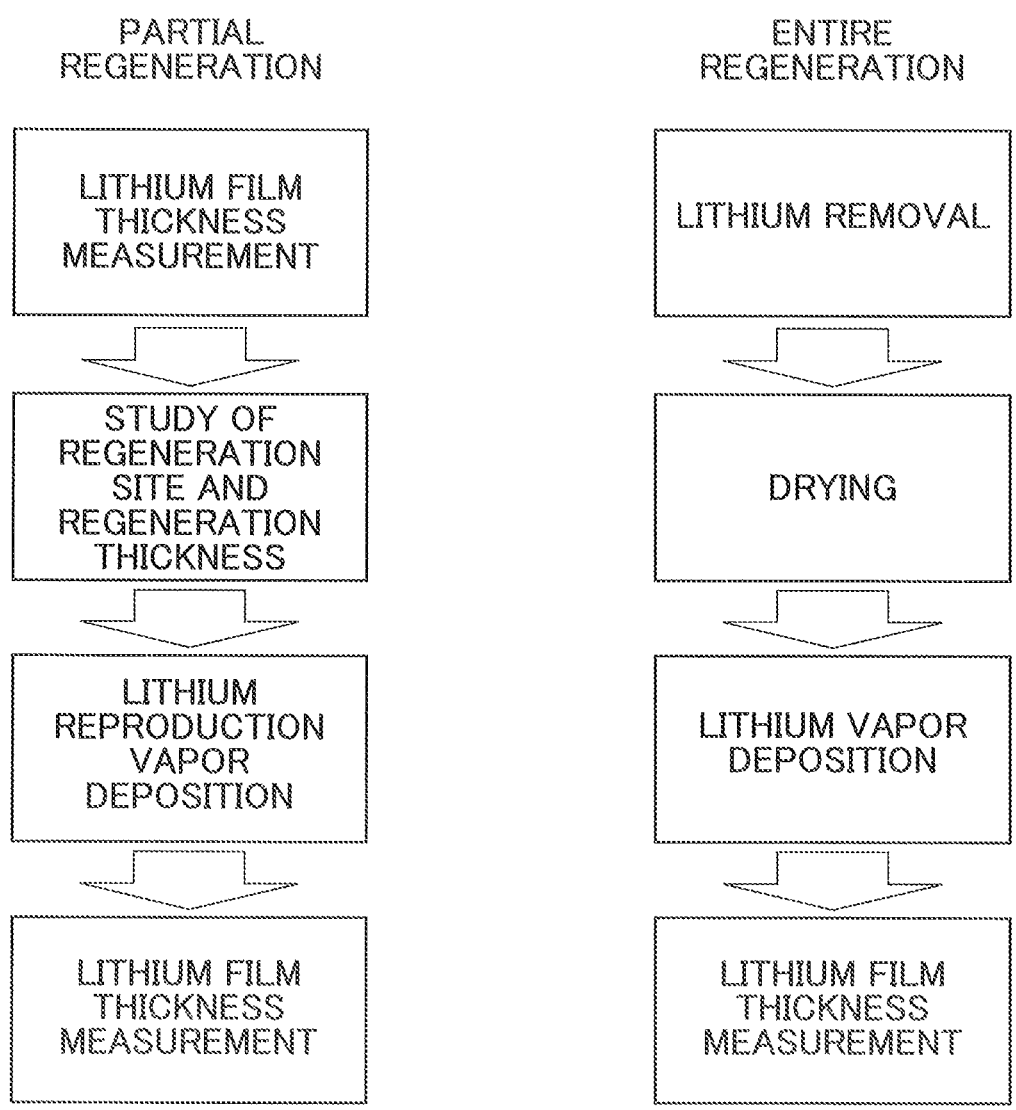
FIG. 6 is a flow diagram illustrating a regenerating method of the automatic lithium target regenerating apparatus according to the present invention.

Next, a regenerating method of the automatic lithium target regenerating apparatus according to the above-mentioned embodiment is described. As illustrated in FIG. 6, the regenerating method includes two regenerating methods: partial regeneration and entire regeneration.

Figure 7:
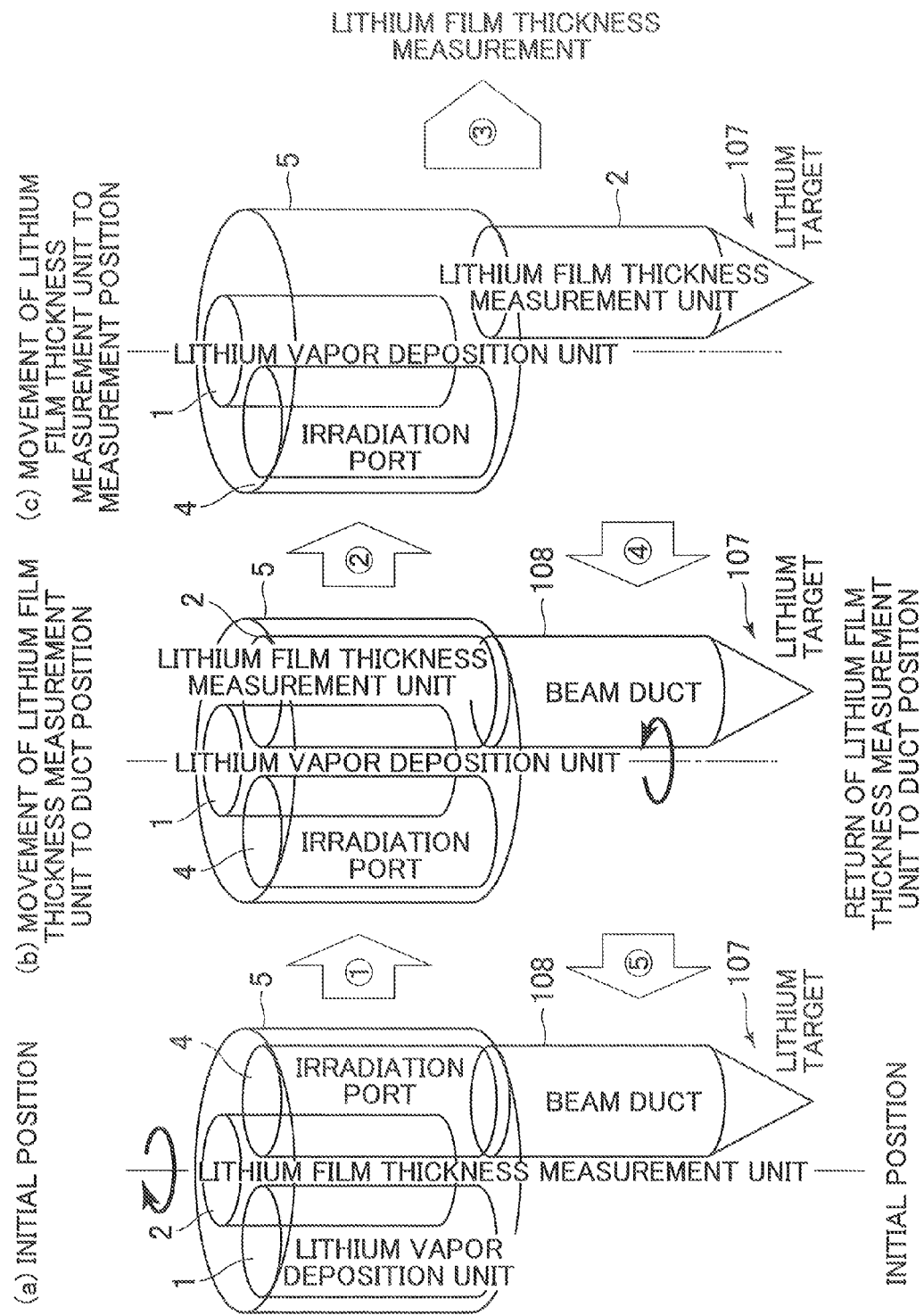
FIGS. 7 are schematic views illustrating states of the lithium vapor deposition unit, the lithium film thickness measurement unit, and an irradiation port during measurement of a lithium film thickness.

The partial regenerating method involves first measuring a lithium thin film of a lithium target in the target unit 107. This measurement is performed by the lithium film thickness measurement unit 2. FIG. 7(a) illustrates a state in which the irradiation port 4 is disposed between the beam duct 108 on the upstream side and the beam duct 108 on the downstream side, with the axis line of the irradiation port 4 being disposed on a track of a proton beam of the beam duct, that is, the automatic lithium target regenerating apparatus 106 is present at the initial position. The lithium vapor deposition unit 1, the lithium film thickness measurement unit 2, and the irradiation port 4 are driven to rotate by 120° in the circumferential direction in the main body 5 from the state at the initial position to obtain a state in which the lithium film thickness measurement unit 2 is disposed between the beam duct 108 on the upstream side and the beam duct 108 on the downstream side, with the axis line of the lithium film thickness measurement unit 2 being aligned with the track of the proton beam (state at a storage position) as illustrated in FIG. 7(b). Next, as illustrated in FIG. 7(c), the lithium film thickness measurement unit 2 is moved to the lithium target side in the beam duct 108 and stopped at a measurement position by the unit control portion 17 (see FIG. 4).

Figure 8:
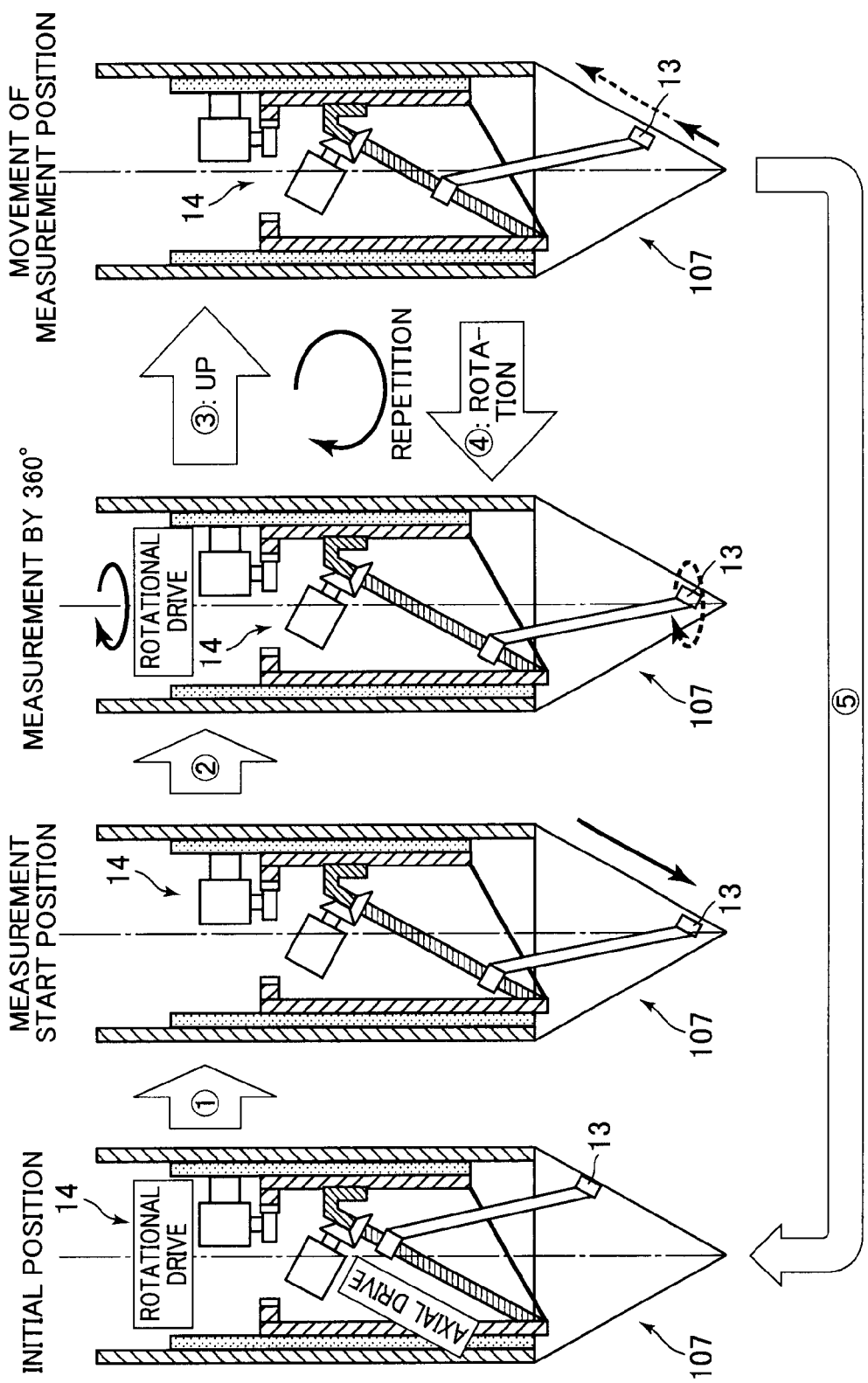
FIG. 8 is a schematic view illustrating the lithium film thickness measurement unit during measurement of the lithium film thickness.

Next, as illustrated in FIG. 8, the sensor accuracy drive unit 14 includes a tubular member which is disposed by appropriate means so as to rotate in the lithium film thickness measurement unit 2. The tubular member is designed so as to receive a drive force of a stepping motor for rotational drive (motor disposed in an upper part of FIG. 8) fixed to the unit 2 side in the lithium film thickness measurement unit 2 through a pair of gears, and is driven to rotate with the drive force of the motor for rotational drive. The motor for rotational drive rotates in a step unit determined by a pulse signal required for rotation by 360°. Further, a shaft with thread is provided rotatably inside the tubular member in a tilted manner with respect to an axis line direction of the tubular member. The shaft with thread is designed so as to receive a drive force of a stepping motor for axial drive (motor disposed in a lower part of FIG. 8) fixed to the inside of the tubular member through a pair of gears, and is driven to rotate with the drive force of the motor for axial drive. A shaft-shaped support member is mounted to the shaft with thread so as to move along the shaft with thread. The support member has a screw part in an upper end portion, the screw part being screwed into a screw part of the shaft with thread. The support member has a sensor 13 mounted thereto in a lower end portion. The motor for axial drive is designed so as to perform zero-point correction constantly at the initial position and rotates in a step unit determined by a pulse signal required for movement to a target center. First, the sensor 13 is driven in an axial direction by rotating the shaft with thread with the motor for axial drive of the sensor accuracy drive unit 14 and moved to a center portion of the lithium target in the target unit 107. Then, the sensor 13 is driven to rotate by 360° along an inner wall surface of a lithium thin film of the lithium target in the target unit 107 by the stepping motor for rotational drive of the sensor accuracy drive unit 14, and the lithium film thickness control unit 12 collects measurement data on the lithium thin film of the lithium target. When the measurement data is collected by the rotational drive of 360°, the sensor 13 is driven upward in an axial direction by a predetermined amount by the motor for axial drive of the sensor accuracy drive unit 14. The sensor 13 is driven to rotate by 360° along the inner wall surface of the lithium thin film of the lithium target in the target unit 107, and the lithium film thickness control unit 12 collects measurement data on the lithium thin film of the lithium target. This operation is repeated to collect the measurement data on the entire lithium thin film of the lithium target. When the measurement operation is finished, the lithium film thickness measurement unit 2 is returned to a state in which the lithium film thickness measurement unit 2 is disposed between the beam ducts 108 in the automatic lithium target regenerating apparatus 106 (state at the storage position) by the unit drive control portion 17 (see FIG. 4), and the lithium vapor deposition unit 1, the lithium film thickness measurement unit 2, and the irradiation port 4 are driven to rotate by −120° in the circumferential direction in the main body 5 to return to the state at the initial position as illustrated in FIG. 7(a).

Figure 9:
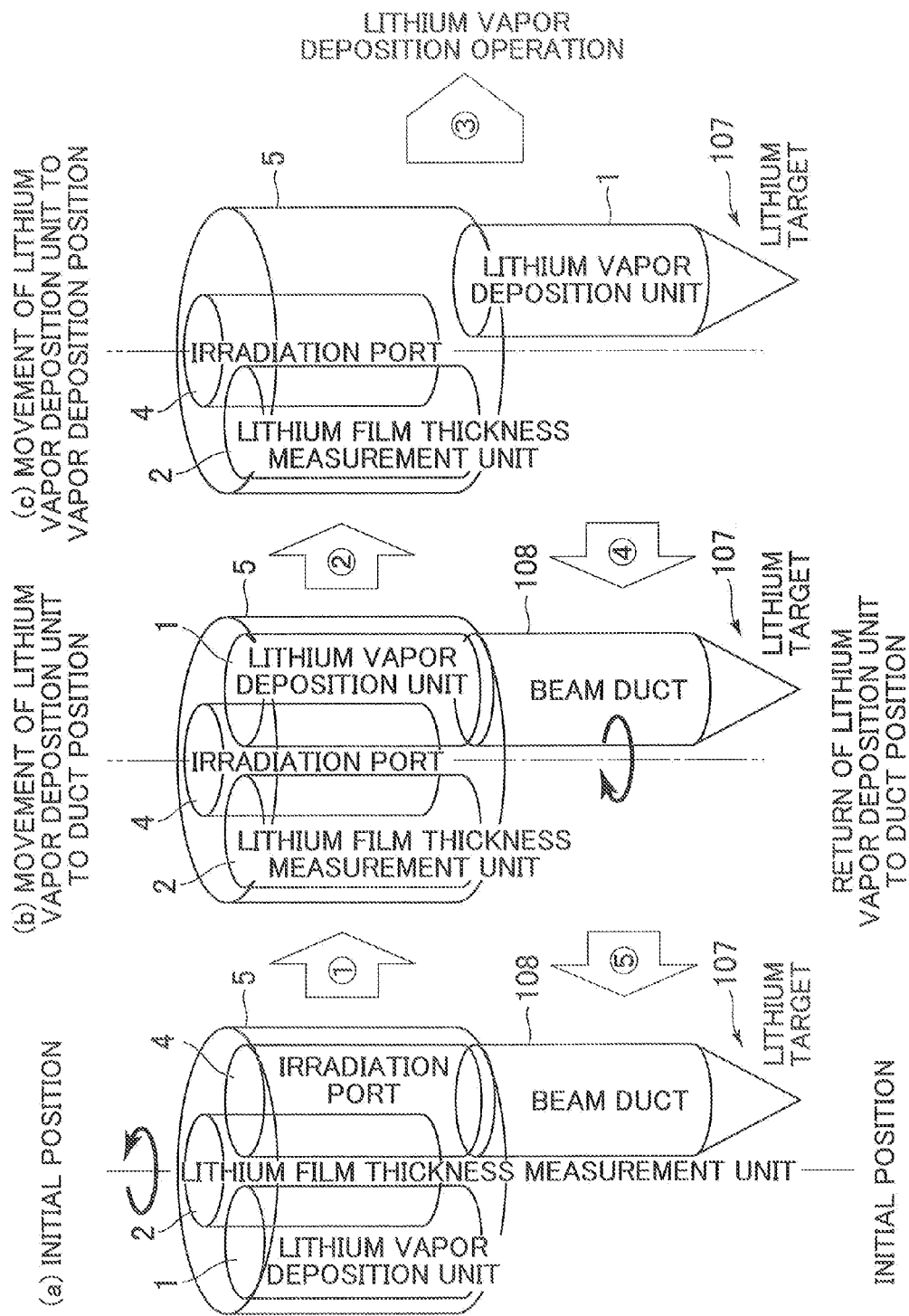
FIGS. 9 are schematic views illustrating states of the lithium vapor deposition unit, the lithium film thickness measurement unit, and the irradiation port during lithium vapor deposition.

The measurement data on the entire lithium thin film of the lithium target is collected by the lithium film thickness control unit 12, and the host computer 18 analyzes the measurement data and studies a regeneration site and/or a regeneration thickness. The lithium vapor deposition unit 1 performs lithium regeneration vapor deposition on the lithium target based on the studied data. FIG. 9(a) illustrates a state in which the irradiation port 4 is disposed between the beam duct 108 on the upstream side and the beam duct 108 on the downstream side, that is, the automatic lithium target regenerating apparatus 106 is present at the initial position, which is the same state as that of FIG. 7(a). The lithium vapor deposition unit 1, the lithium film thickness measurement unit 2, and the irradiation port 4 are driven to rotate by 240° in the circumferential direction in the main body 5 from the state at the initial position to obtain a state in which the lithium vapor deposition unit 1 is disposed between the beam ducts 108 (state at the storage position) as illustrated in FIG. 9(b). Next, as illustrated in FIG. 9(c), the lithium vapor deposition unit 1 is moved to the lithium target side in the beam duct 108 by the drive control portion 11 (see FIG. 3) and fixed at a vapor deposition operation position (vapor deposition initial position).

Figure 10:
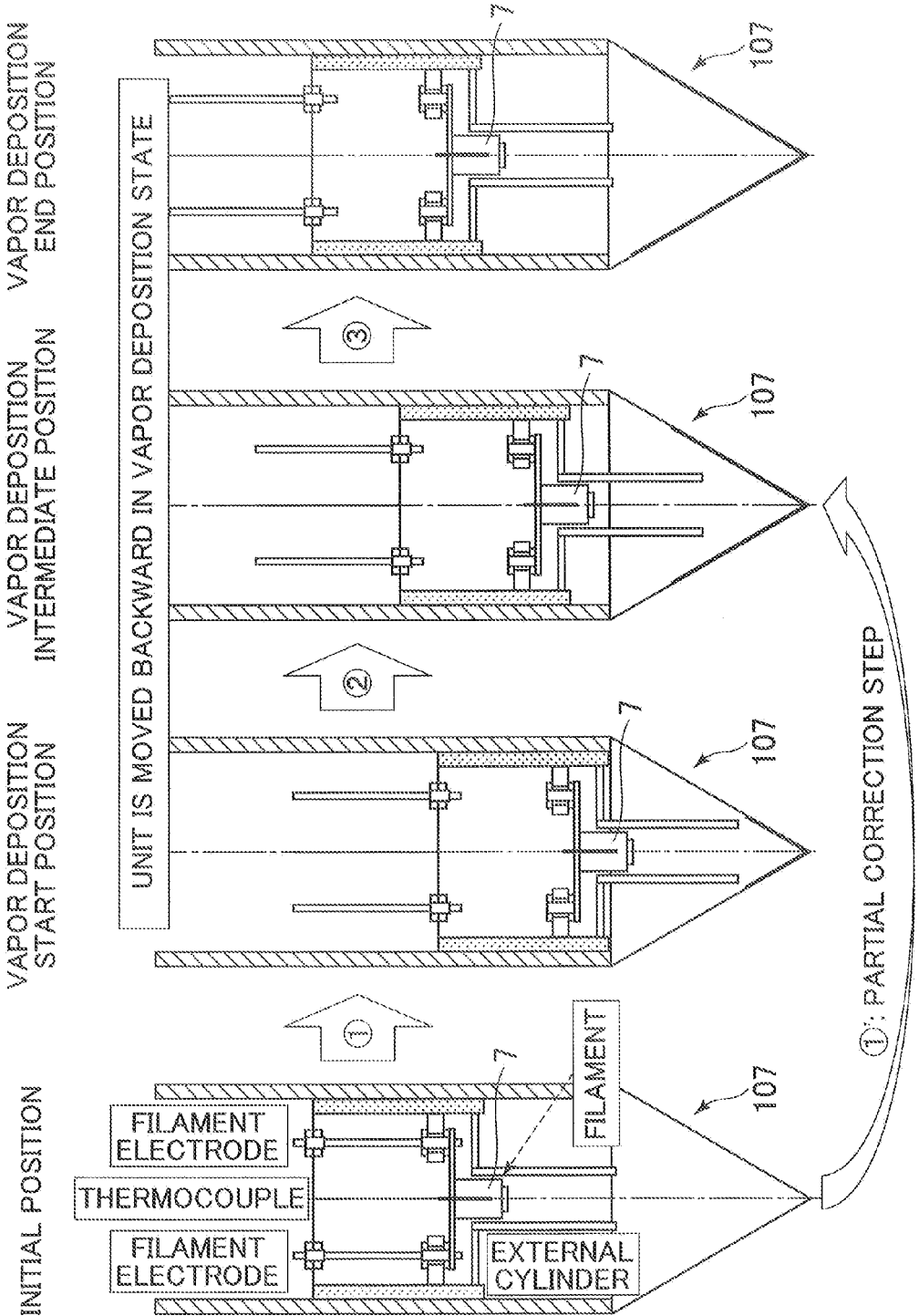
FIG. 10 is a schematic view illustrating the lithium vapor deposition unit during lithium vapor deposition.

Next, as illustrated in FIG. 10, the filament 7 and the like are moved to a regeneration position by the drive control portion 11 based on the measurement data on the entire lithium thin film, and vapor deposition is performed while the lithium vapor deposition unit 1 is driven upward by the drive control portion 11 in accordance with the vapor deposition condition. As illustrated in FIG. 10, the filament 7 is provided with an external cylinder extending forward so as to surround the front circumference of the filament 7, and the filament 7 is designed so as to move together with the external cylinder by a guide bar. When the regeneration vapor deposition operation is finished, the lithium vapor deposition unit 1 is returned to the state of FIG. 9(b) in which the lithium vapor deposition unit 1 is disposed between the beam ducts 108 (state at the storage position) by the drive control portion 11 (see FIG. 3), and the lithium vapor deposition unit 1, the lithium film thickness measurement unit 2, and the irradiation port 4 are driven to rotate by −240° in the circumferential direction in the main body 5 to return to the state at the initial position illustrated in FIG. 9(a).

Next, a film thickness of the lithium thin film of the lithium target in the target unit 107 is measured by the lithium film thickness measurement unit 2 in accordance with the above-mentioned measurement method, and an operation of checking regeneration vapor deposition is performed. In the case where the checking operation finds that regeneration vapor deposition of a desired lithium thin film has not been performed, the lithium regeneration vapor deposition of the lithium target is performed by the lithium vapor deposition unit 1 based on the checked data in accordance with the above-mentioned vapor deposition method. After that, an operation of checking the regeneration vapor deposition is performed. This operation may be repeated until the regeneration vapor deposition of a desired lithium thin film is performed.

Figure 11:
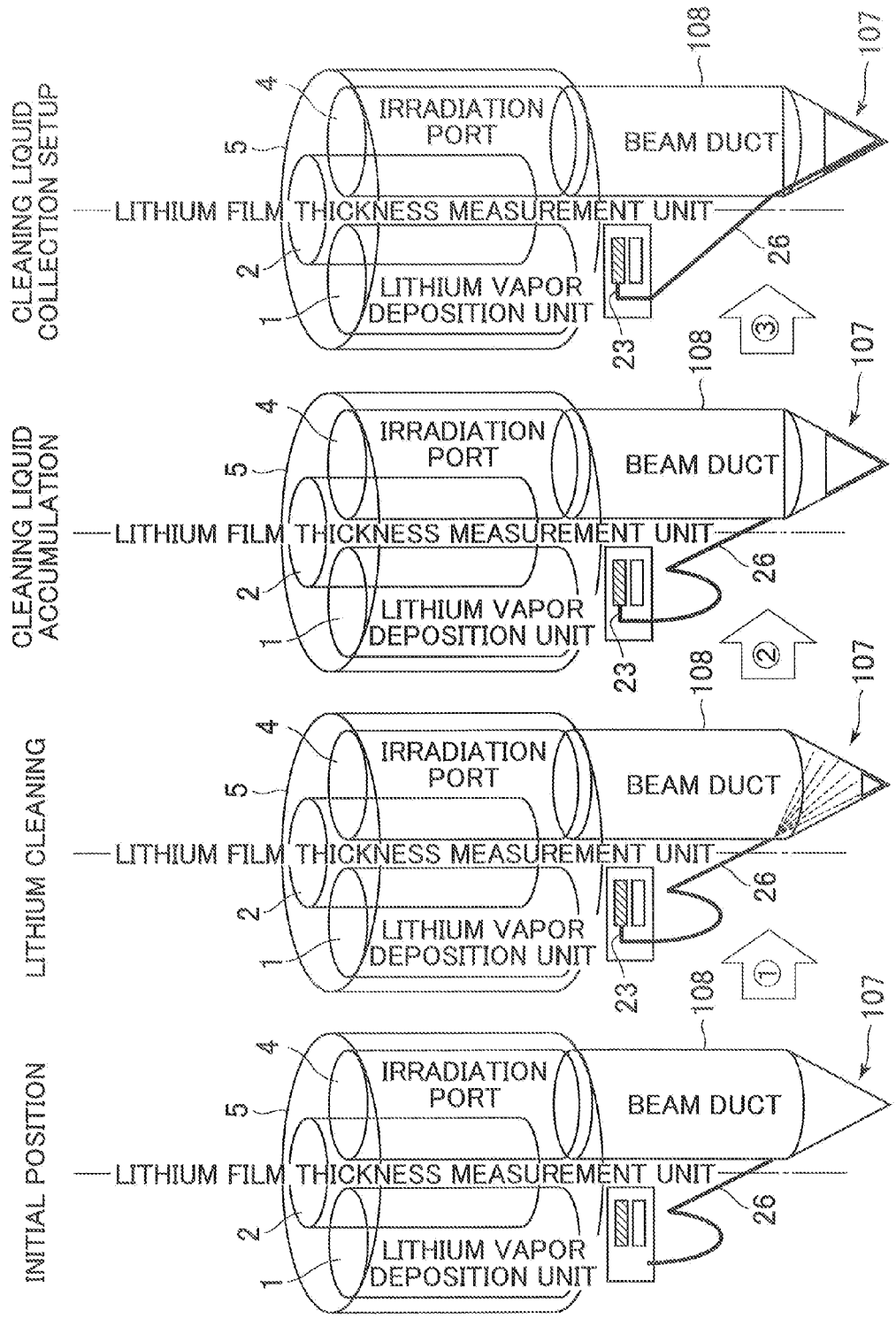
FIG. 11 is a schematic view illustrating states of the lithium vapor deposition unit, the lithium film thickness measurement unit, and the irradiation port during cleaning and removing of lithium.

Next, a regenerating method based on entire regeneration is described. The entirely regenerating method involves first removing a lithium thin film of a lithium target in the target unit 107 by the lithium removal unit 3 (see FIG. 5) and drying the surface of the target. As illustrated in FIG. 11, the lithium thin film of the lithium target in the target unit 107 is removed by the lithium removal unit 3 while the irradiation port 4 is disposed between the beam duct 108 on the upstream side and the beam duct 108 on the downstream side, that is, while the irradiation port 4 is disposed at the initial position. First, the removal control unit 19 (see FIG. 5) causes cleaning liquid (water/alcohol) of the cleaning liquid line 23 to be jetted in a predetermined amount so that the cleaning liquid is sprayed in a shower manner onto the surface of the target. In this case, a vacuum condition or a condition at normal pressures may be selected appropriately. As a result of the jetting of a predetermined amount, the cleaning liquid accumulates in the target. After that, as illustrated in FIG. 12, the cleaning liquid accumulating in the target is discharged to the waste tank 22 through the vacuum valve 21 (see FIG. 5). After the discharge, the surface of the target is dried with hot air sent through the drying line 24 by the removal control unit 19 (see FIG. 5). After the surface of the target is dried completely, vacuuming is performed by controlling the vacuum pump 20 with the removal control unit 19.

After the lithium thin film of the lithium target in the target unit 107 is removed as described above, entire lithium regeneration vapor deposition of the lithium target is performed by the lithium vapor deposition unit 1. The lithium vapor deposition unit 1, the lithium film thickness measurement unit 2, and the irradiation port 4 are driven to rotate by 240° in the circumferential direction in the main body 5 from the state at the initial position illustrated in FIG. 9(a) to obtain a state in which the lithium vapor deposition unit 1 is disposed between the beam ducts 108 (state at the storage position) as illustrated in FIG. 9(b). Next, as illustrated in FIG. 9(c), the lithium vapor deposition unit 1 is moved to the lithium target side in the beam duct 108 by the drive control portion 11 (see FIG. 3) and fixed at a vapor deposition operation position (vapor deposition initial position).

Next, as illustrated in FIG. 10, the filament 7 and the like are moved to a prescribed position by the drive control portion 11, and vapor deposition is performed while the lithium vapor deposition unit 1 is driven by the drive control portion 11 under the vapor deposition condition. When the entire regeneration vapor deposition operation is finished, the lithium vapor deposition unit 1 is returned to a state in which the lithium vapor deposition unit 1 is disposed between the beam ducts 108 (state at the storage position) by the drive control portion 11 (see FIG. 2), and the lithium vapor deposition unit 1, the lithium film thickness measurement unit 2, and the irradiation port 4 are driven to rotate by −240° in the circumferential direction in the main body 5 to return to the state at the initial position illustrated in FIG. 9(*a*).

Next, a lithium thin film of the lithium target in the target unit 107 is measured by the lithium film thickness measurement unit 2 in accordance with the same measurement method as that of the partially regenerating method, and an operation of checking regeneration vapor deposition is performed. In the case where the checking operation finds that the entire regeneration vapor deposition of a desired lithium thin film has not been performed, lithium regeneration vapor deposition of the lithium target is performed by the lithium vapor deposition unit 1 based on the checked data. After that, an operation of checking the regeneration vapor deposition is performed. This operation may be repeated until the entire regeneration vapor deposition of a desired lithium thin film is performed.

In the above-mentioned embodiment, the apparatus having a switching mechanism is described as an example. However, as described in the paragraph [0022], the present invention is also applicable to a system not including a switching mechanism, that is, an integrated chamber system in which each process is integrated partially or entirely. Also in this case, the present invention includes a "partially regenerating function" and an "entirely regenerating function" of a lithium target.

Further, a target to be converted into neutrons is constantly degraded or mechanically damaged due to the collision with a proton beam or other particle beams, even when the target is metals other than a lithium metal. Thus, the constant measurement of a metal thickness and the partially and entirely regenerating functions are functional systems required for supplying stable neutrons. Accordingly, the target is a "core technology" of the neutron capture therapy, and the present invention may also be applied to other metals such as beryllium, as well as lithium. That is, the present invention is also applicable to a target in which a metal (for example, beryllium, etc.) other than a lithium metal is formed on a support (substrate) made of copper which is a mother body of the target.

REFERENCE SIGNS LIST

1 lithium vapor deposition unit
2 lithium film thickness measurement unit
3 lithium removal unit
4 irradiation port
5 main body
6 vapor deposition control unit
7 filament
8 evaporation source
9 temperature monitor
10 vapor deposition control portion
11 drive control portion
12 lithium film thickness control unit
13 measurement sensor
14 sensor accuracy drive unit
15 measurement control portion
16 sensor drive control portion
17 unit drive control portion
18 host computer
19 removal control unit
20 vacuum pump
21 vacuum valve
22 waste tank
23 cleaning liquid line
24 drying line
25 vacuum valve
26 nozzle line
100 accelerator
101 ion source
102 LEBT
103 RFQ linac
104 RFI linac
105 bending magnet
106 automatic lithium target regenerating apparatus
107 target unit
108 beam duct (beam transport)

The invention claimed is:

1. An automatic lithium target regenerating apparatus designed to regenerate lithium of a lithium target,
the lithium target regenerating apparatus comprising:
a lithium vapor deposition evaporation source movably coupled to a main body,
a lithium film thickness measurement sensor movably coupled to the main body,
a switching mechanism comprising a rotary drive, a linear drive, or both, operably coupled to the main body to move each of the lithium vapor deposition evaporation source and the lithium film thickness measurement sensor into a single lithium target side position and out of the single lithium target side position and away from the lithium target,
wherein, when the switching mechanism moves the lithium vapor deposition evaporation source into the single lithium target side position, the lithium film thickness measurement sensor is positioned outside the single lithium target side position and away from the lithium target by the switching mechanism, and the lithium vapor deposition evaporation source is positioned to vapor-deposit the lithium on the lithium target, and
wherein, when the switching mechanism moves the lithium film thickness measurement sensor into the single lithium target side position, the lithium vapor deposition evaporation source is positioned outside the single lithium target side position and away from the lithium target by the switching mechanism, and the lithium film thickness measurement sensor is positioned to measure a film thickness of the lithium.

2. The automatic lithium target regenerating apparatus according to claim 1, wherein the switching mechanism comprises a rotary drive operably coupled to simultaneously rotate both the lithium vapor deposition evaporation source and the lithium film thickness measurement sensor in the main body.

3. The automatic lithium target regenerating apparatus according to claim 1, further comprising an irradiation port movably coupled to the main body, and
wherein the switching mechanism is further coupled to the main body to move the irradiation port into the single lithium target side position and out of the single lithium target side position and away from the lithium target,
wherein, when the switching mechanism moves the lithium vapor deposition evaporation source into the single lithium target side position, the irradiation port is positioned outside of the single lithium target side position and away from the lithium target by the switching mechanism, wherein, when the switching mechanism moves the lithium film thickness measurement sensor into the single lithium target side position, the irradiation port is automatically positioned outside of the single lithium target side position and away from the lithium target by the switching mechanism, and wherein, when the switching mechanism moves the irradiation port into the single lithium target side position, the lithium vapor deposition evaporation source and the lithium film thickness measurement sensor are positioned outside the single lithium target side position and away from the lithium target by the switching mechanism, and the irradiation port is positioned to irradiate the lithium film.

4. The automatic lithium target regenerating apparatus according to claim 3, wherein the main body includes a first chamber at least partially housing the lithium vapor deposition evaporation source, a second chamber at least partially housing the lithium film thickness measurement sensor, and a third chamber at least partially housing the irradiation port.

5. An automatic lithium target regenerating system, comprising the apparatus according to claim 1, and a lithium removal nozzle line designed to spray a lithium removal liquid from an end of the nozzle line onto a surface of the lithium target.

6. The automatic lithium target regenerating system according to claim 5, wherein the lithium removal nozzle line is positioned adjacent to a beam duct of the automatic lithium target regenerating apparatus.

7. A neutron generating system comprising the automatic lithium target regenerating apparatus according to claim 1, and an accelerator designed to accelerate protons at the lithium target.

8. An automatic lithium target regenerating method, designed to regenerate lithium of a lithium target, the lithium target regenerating method comprising:

mounting a lithium vapor deposition evaporation source and a lithium film thickness measurement sensor to a main body with motors and gears operably coupled to the main body to move the lithium vapor deposition evaporation source and the lithium film thickness measurement sensor into and out of a single lithium target side position, moving the lithium vapor deposition evaporation source via the motors and gears into the single lithium target side position while the lithium film thickness measurement sensor is positioned outside of the single lithium target side position and away from the lithium target, moving the lithium film thickness measurement sensor via the motors and gears into the single lithium target side position while the lithium vapor deposition evaporation source is positioned outside of the single lithium target side position and away from the lithium target, when the lithium vapor deposition evaporation source is in the single target side position, vapor-depositing the lithium on the lithium target with the lithium vapor deposition evaporation source, and when the lithium film thickness measurement sensor is in the single target side position, measuring a film thickness of the lithium with the lithium film thickness measurement sensor.

9. The automatic lithium target regenerating method according to claim 8, wherein the automatic lithium target regenerating method comprises only partially regenerating the lithium target.

10. The automatic lithium target regenerating method according to claim 9, wherein the measuring is performed before the vapor-depositing.

11. The automatic lithium target regenerating method according to claim 9, wherein the measuring is performed after the vapor-depositing.

12. The automatic lithium target regenerating method according to claim 8, wherein the automatic lithium target regenerating method comprises entirely regenerating the lithium target.

13. The automatic lithium target regenerating method according to claim 12, further comprising removing the lithium.

14. The automatic lithium target regenerating method according to claim 13, wherein the removing the lithium comprises:

jetting cleaning liquid to the lithium of the lithium target; and drying the lithium target after the jetting.

15. The automatic lithium target regenerating method according to claim 13, wherein the removing is performed before the vapor-depositing.

16. The automatic lithium target regenerating method according to claim 8, wherein the measuring is performed after the vapor-depositing.

17. A neutron generating method comprising the automatic lithium target regenerating method according to claim 8, and generating neutrons by reacting protons accelerated by an accelerator with the lithium of the lithium target.

18. The automatic lithium target regenerating apparatus according to claim 4, wherein the main body comprises a cylindrical outer shape, and the first, second and third chambers are radially spaced from each other within the main body, and the switching mechanism comprises a rotary drive that engages and rotates the main body.

* * * * *